(12) United States Patent
Wakabayashi et al.

(10) Patent No.: US 10,403,529 B2
(45) Date of Patent: Sep. 3, 2019

(54) CARRIER TRANSPORT DEVICE AND CARRIER TRANSPORT METHOD

(71) Applicant: TOKYO ELECTRON LIMITED, Tokyo (JP)

(72) Inventors: Shinji Wakabayashi, Nirasaki (JP); Keisuke Kondoh, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 67 days.

(21) Appl. No.: 15/550,870

(22) PCT Filed: Dec. 24, 2015

(86) PCT No.: PCT/JP2015/085925
§ 371 (c)(1),
(2) Date: Aug. 14, 2017

(87) PCT Pub. No.: WO2016/132651
PCT Pub. Date: Aug. 25, 2016

(65) Prior Publication Data
US 2018/0033663 A1 Feb. 1, 2018

(30) Foreign Application Priority Data
Feb. 17, 2015 (JP) ................................. 2015-028153

(51) Int. Cl.
*H01L 21/67* (2006.01)
*H01L 21/677* (2006.01)

(52) U.S. Cl.
CPC .... *H01L 21/67733* (2013.01); *H01L 21/6773* (2013.01); *H01L 21/67736* (2013.01); *H01L 21/67772* (2013.01); *H01L 21/67775* (2013.01)

(58) Field of Classification Search
CPC ................................................ H01L 21/67733
See application file for complete search history.

(56) References Cited

U.S. PATENT DOCUMENTS 6,579,052 B1 * 6/2003 Bonora ............. H01L 21/67161
414/222.01
2001/0043849 A1 * 11/2001 Perlov ............... H01L 21/67167
414/222.01

(Continued)

FOREIGN PATENT DOCUMENTS

| JP | 11-314890 A | 11/1999 |
| JP | 2001-53131 A | 2/2001 |
| JP | 2002-293403 A | 10/2002 |

OTHER PUBLICATIONS

International Search Report dated Mar. 15, 2016 issued in corresponding International Application No. PCT/JP2015/085925.

*Primary Examiner* — Ronald P Jarrett
(74) *Attorney, Agent, or Firm* — Nath, Goldberg & Meyer; Jerald L. Meyer

(57) ABSTRACT

A carrier transport device capable of delivering a carrier to and from an external transport device which transports the carrier is provided. The carrier transport device includes a housing on which the carrier is mountable, first ports provided in the housing and configured to deliver the carrier to and from the external transport device, second ports provided in the housing and provided with a lid opening/closing mechanism, and a transfer machine provided in the housing and configured to transfer the carrier. The first ports, the transfer machine and the second ports are disposed under a transport path of the external transport device. The first ports and the second ports are disposed on both sides of the transfer machine. The second ports are configured at multiple stages.

6 Claims, 10 Drawing Sheets

(56) References Cited

U.S. PATENT DOCUMENTS

| | | | |
|---|---|---|---|
| 2003/0202868 A1* | 10/2003 | Bachrach | H01L 21/6773 414/277 |
| 2010/0228378 A1* | 9/2010 | Fukutomi | H01L 21/67766 700/112 |
| 2016/0307783 A1* | 10/2016 | Iida | H01L 21/67167 |

* cited by examiner

A-A cross section

C-C cross section

CARRIER TRANSPORT DEVICE AND CARRIER TRANSPORT METHOD

This is a National Phase Application filed under 35 U.S.C. 371 as a national stage of PCT/JP2015/085925, filed Dec. 24, 2015, an application claiming the benefit of Japanese Application No. 2015-028153, filed Feb. 17, 2015, the content of each of which is hereby incorporated by reference in its entirety.

TECHNICAL FIELD

The present disclosure relates to a carrier transport device and a carrier transport method.

BACKGROUND

A substrate processing system for finely processing a semiconductor wafer (hereinafter simply referred to as "wafer") includes, for example, a load port on which a FOUP (Front Opening Unified Pod) accommodating a plurality of wafers is mounted and a vacuum processing chamber which processes a wafer.

In the substrate processing system, the wafer is transferred from the FOUP mounted on the load port to the vacuum processing chamber via a load lock chamber and a transfer chamber (see, for example, Patent Document 1).

In recent years, from the viewpoint of improving the throughput, the number of process modules provided in a substrate processing system is increasing. In such a substrate processing system, different processes may be performed for each process module. As an example, each of the process modules may be associated with a wafer lot, and each of the process modules may process the wafers of only one corresponding lot. In this case, the wafers are not transported in order among the respective process modules, but are transported between one of the process modules and a load port. In this case, it is preferable that the number of load ports is equal to or more than the number of process modules. Therefore, in a substrate processing system having a large number of process modules, the number of load ports disposed in a loader module (a carrier transport device) increases.

PRIOR ART DOCUMENTS

Patent Documents

Patent Document 1: Japanese laid-open publication No. 2001-53131

When a plurality of load ports are linearly arranged on one side of the loader module, the size (footprint) of the loader module increases, which may make it difficult to arrange the substrate processing system in a clean room.

SUMMARY

The present disclosure provides embodiments of a carrier transport device and a carrier transport method that minimizes or reduces the footprint of a carrier transport device.

According to one embodiment of the present disclosure, there is provided a carrier transport device capable of delivering a carrier to and from an external transport device which transports the carrier, the carrier transport device including: a housing on which the carrier is mountable; first ports provided in the housing and configured to deliver the carrier to and from the external transport device; second ports provided in the housing and provided with a lid opening/closing mechanism; and a transfer machine provided in the housing and configured to transfer the carrier, wherein the first ports, the transfer machine and the second ports are disposed under a transport path of the external transport device, the first ports and the second ports are disposed on both sides of the transfer machine, and the second ports are configured at multiple stages.

Effect of Invention

According to one aspect of the present disclosure, it is possible to limit the footprint of the carrier transport device

DETAILED DESCRIPTION

Figure 1:
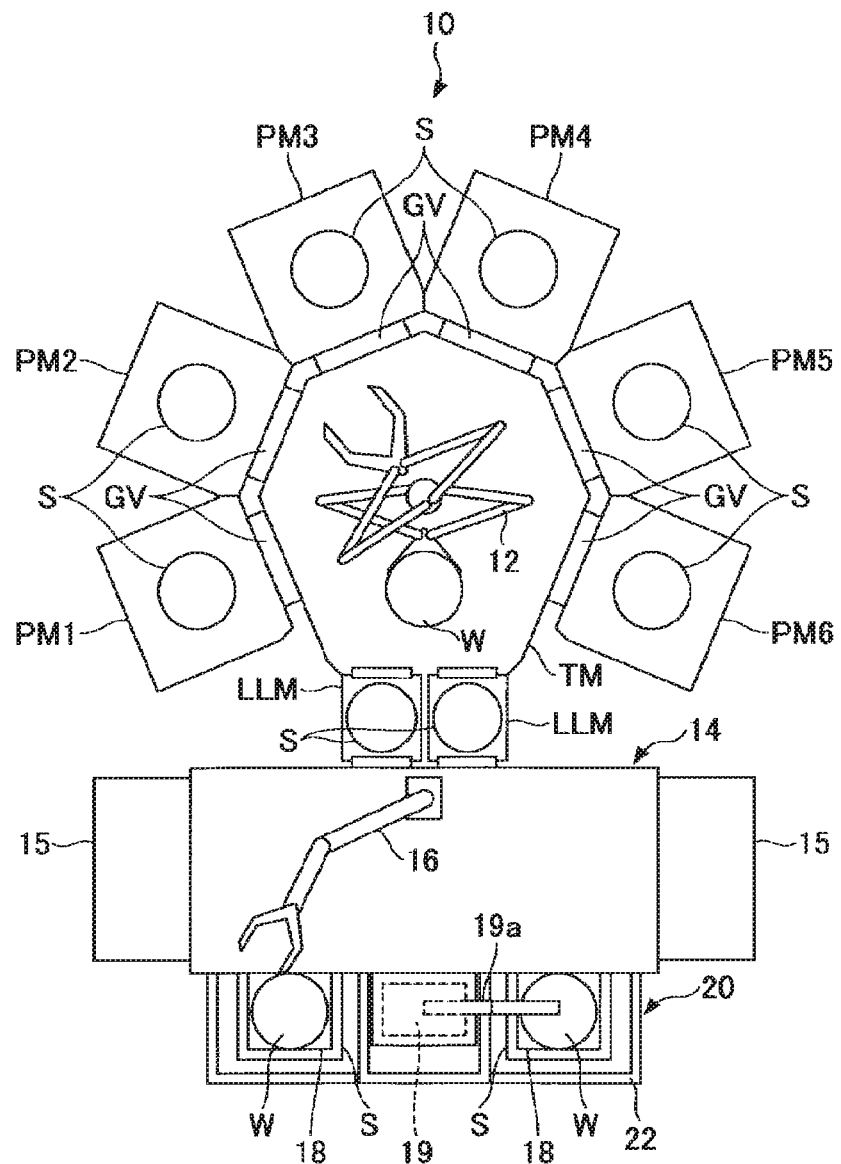
FIG. 1 is a view showing an example of a substrate processing system according to one embodiment.

Embodiments for carrying out the present disclosure will now be described with reference to the drawings. In the subject specification and the drawings, substantially the same components are denoted by like reference numerals, and redundant description thereof will be omitted.

[Overall Configuration of Substrate Processing System]

First, an overall configuration of a substrate processing system 10 according to one embodiment of the present disclosure will be described with reference to FIG. 1. In this embodiment, a cluster type substrate processing system is taken as an example of the substrate processing system 10. However, the substrate processing system 10 is not limited to the cluster type.

In FIG. 1, the substrate processing system 10 includes a transfer module TM as a vacuum transfer chamber having a substantially heptagonal shape in a plan view, and six process modules PM1 to PM6 radially arranged around the transfer module TM and connected to the transfer module TM via a gate valve GV. The substrate processing system 10 includes two load lock modules LLM as atmosphere/vacuum switching chambers and a loader module 14 as an atmospheric transfer chamber.

The two load lock modules LLM are connected to a side surface of the transfer module TM not connected to the process modules PM1 to PM6. The loader module 14 is connected to the respective load lock modules LLM at a position opposite to the transfer module TM.

The transfer module TM incorporates a transfer mechanism 12 that transfers a wafer W among the process modules PM1 to PM6 or among the process modules PM1 to PM6 and the load lock modules LLM. The inside of the transfer module TM is depressurized to a predetermined degree of vacuum.

Each of the process modules PM1 to PM6 includes one stage S on which the wafer W is mounted. The inside of each of the process modules PM1 to PM6 is depressurized to a predetermined degree of vacuum. Each of the process modules PM1 to PM6 performs a predetermined plasma process, for example, a dry etching process, on the wafer W mounted on the stage S. However, it is not necessary for the process modules PM1 to PM6 to perform the plasma process. For example, the process modules PM1 to PM6 may process the wafer W finely by a method of forming a film through a heat treatment or the like.

The loader module 14 incorporates a transfer robot 16 for transferring a wafer W between a carrier transfer device 20 and each load lock module LLM. The inside of the loader module 14 is maintained at atmospheric pressure.

Each of the load lock modules LLM includes a stage S on which a wafer W is mounted, and the interior thereof may be switched between an atmospheric pressure environment and a depressurized environment. For example, when transferring the wafer W to and from the transfer robot 16 of the loader module 14, the inside of each of the load lock modules LLM is switched to the atmospheric pressure environment and is brought into communication with the inside of the loader module 14. Further, for example, when transferring the wafer W to and from the transfer mechanism 12 of the transfer module TM, the inside of each of the load lock modules LLM is switched to the depressurized environment and is brought into communication with the inside of the transfer module TM. That is, the inside of each of the load lock modules LLM is switched to the atmospheric pressure environment or the depressurized environment, and the wafer W is exchanged between the transfer module TM and the loader module 14.

Expansion modules 15 are provided on both sides of the loader module 14. The expansion modules 15 have a width of about 300 mm to 400 mm. A measuring instrument and the like may be provided in the expansion modules 15.

[Configuration of Carrier Transport Device and Transport Method]

A configuration of a carrier transport device 20 according to a first embodiment of the present disclosure will be described with reference to FIGS. 1, 2A and 2B. On one side surface of the loader module 14 opposite to the load lock modules LLM, a carrier transport device 20 is provided. The carrier transport device 20 is a device capable of delivering a FOUP 18 to and from a ceiling suspended external transport device 50 (OHT (Overhead Hoist Transport); hereinafter also referred to as "suspended external transport device"). One lot consists of, for example, 25 wafers. The FOUP 18 accommodates, for example, 25 wafers W of one lot. A container such as a FOUP 18 or the like for accommodating substrates is one example of a carrier. The suspended external transport device 50 is one example of an external transport device. Other examples of the external transport device may include an external transport device for transporting the FOUP 18 using a frame-like rail formed in a region other than the ceiling, for example, a space under the ceiling, and a floor traveling vehicle.

Figure 2A:
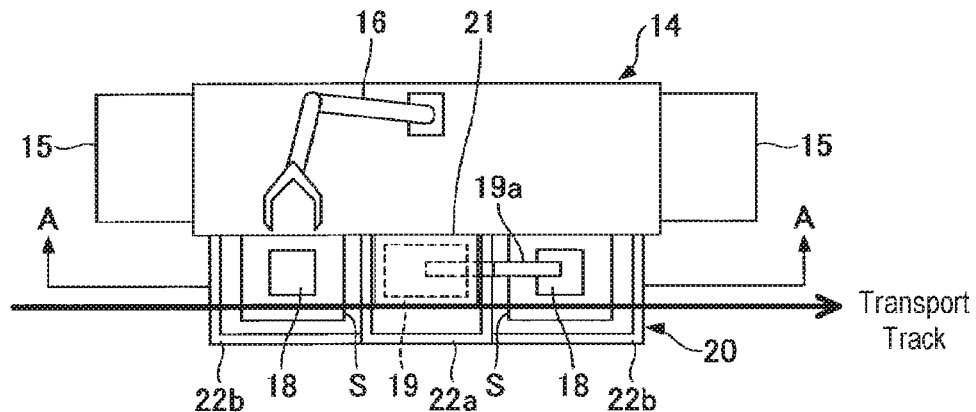
FIGS. 2A and 2B are views showing examples of a carrier transport device according to a first embodiment.
Figure 2B:
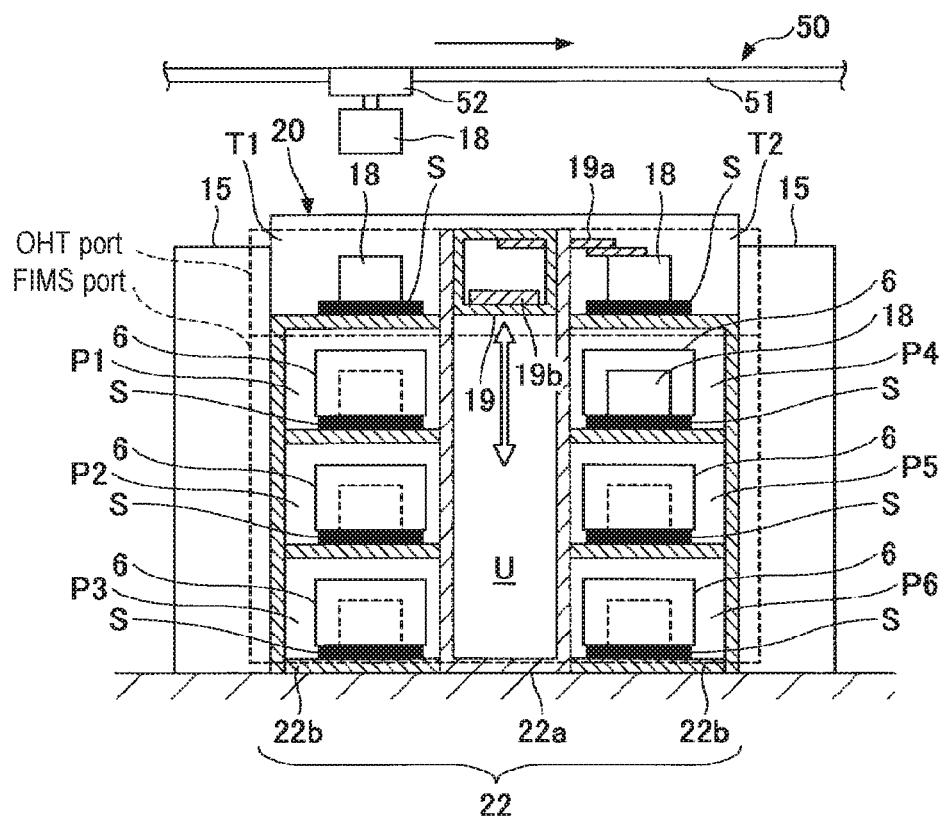

In FIG. 2B, there is shown a cross section of the carrier transport device 20 taken along line A-A in FIG. 2A. As shown in FIG. 2B, the carrier transport device 20 receives a FOUP from the suspended external transport device 50. The suspended external transport device 50 holds the FOUP 18 on a traveling vehicle 52 guided by a rail 51 provided on the ceiling and transports the FOUP 18 overhead in a hoist manner.

The carrier transport device 20 includes a housing 22 on which the FOUP 18 can be mounted. The housing 22 includes a rectangular parallelepiped frame body 22a arranged in the central portion thereof and mounting tables 22b arranged on both sides of the frame body 22a.

An OHT port for delivering the FOUP to and from the suspended external transport device 50 is provided in the uppermost stage (the fourth stage from the bottom) of the housing 22. The mounting tables 22b are lower in height than the frame body 22a by the height of the OHT port of the uppermost stage. A stage S on which the FOUP 18 delivered to and from the suspended external transport device 50 is mounted is provided on the upper surface of each of the mounting tables 22b disposed on both sides of the frame body 22a. The OHT port is one example of a first port provided in the housing 22 and configured to deliver the FOUP to and from the suspended external transport device 50.

The transfer machine 19 is a hollow rectangular parallelepiped body and includes a rotatable/slidable arm 19a and a stage 19b on which the FOUP 18 is mounted. The transfer machine 19 can move up and down in the internal space of the frame body 22a. The arm 19a may have only a sliding function.

When delivering the FOUP between the suspended external transport device 50 and the carrier transport device 20, the suspended external transport device 50 mounts the FOUP 18 accommodating unprocessed wafers on the uppermost stage S of the mounting table 22b shown in FIG. 2B. The transfer machine 19 is located in the uppermost portion of the frame body 22a. The transfer machine 19 grips the FOUP 18 mounted on the stage S and transfers the FOUP 18 to a FIMS (Front-Opening Interface Mechanical Standard) port.

The FIMS port is located under the OHT port and is arranged vertically at three stages on each side of the frame body 22a. In the present embodiment, the carrier transport device 20 includes six FIMS ports P1 to P6. However, the present disclosure is not limited to the arrangement in which six FIMS ports are located vertically at three stages. The FIMS ports may be arranged at multiple stages (two or more stages).

Each of the FIMS ports P1 to P6 includes a lid opening/closing mechanism 6 and a stage S. On the stage S, the FOUP 18 accommodating the wafers is mounted. Specifically, the FOUP 18 is gripped by the transfer machine 19 and is transferred from the OHT port T1 to the stage S of one of the FIMS ports P1 to P6. The unprocessed wafer in the FOUP 18 is transferred to the side of the loader module 14 shown in FIG. 1 by opening the FOUP 18 with the lid opening/closing mechanism 6. The unprocessed wafer is sequentially transferred to the loader module 14, the load lock module LLM, the transfer module TM, and one of the process modules PM1 to PM6.

The FIMS port is an example of a second port provided with a lid opening/closing mechanism. As the FOUP 18 is opened by the lid opening/closing mechanism 6, the FIMS port carries the unprocessed wafer to the loader module 14 or carries the processed wafer from the loader module 14.

In recent years, from the viewpoint of improving the throughput, the number of process modules provided in the substrate processing system 10 is increasing. For example, in the substrate processing system 10 according to the present embodiment, six process modules PM1 to PM6 are provided. In such a substrate processing system 10, different processes may be performed for the process modules respectively. As an example, each of the process modules PM1 to PM6 may be associated with a wafer lot, and each of the process modules PM1 to PM6 may process only the wafers of one corresponding lot.

In this case, the wafer is not transported sequentially among the process modules PM1 to PM6 but reciprocates between one process module and one FIMS port. In this case, it is preferable that the number of FIMS ports is equal to or more than the number of process modules. For example, in the substrate processing system 10 according to the present embodiment, six FIMS ports P1 to P6 are arranged for the six process modules PM1 to PM6. Thus, for example, the process modules PM1 to PM6 are associated with the FIMS ports P1 to P6 on a one-to-one correspondence basis so that the wafer reciprocates between a specific process module and a specific FIMS port. As a result, it is possible to execute satisfactory substrate processing even when different processes are performed for the process modules respectively.

As described above, according to the carrier transport device 20 having such a configuration, the OHT ports T1 and T2, the transfer machine 19 and the FIMS ports P1 to P6 are disposed directly under the transport trajectory of the suspended external transfer device 50 as shown in FIG. 2B. The OHT ports T1 and T2, and the FIMS ports P1 to P6 are disposed on both sides of the transfer machine 19. The FIMS ports P1 to P6 are configured at multiple stages.

According to this configuration, the FIMS ports P1 to P6 are arranged so as to overlap with the OHT ports T1 and T2 in the height direction of the housing 22 in a plan view. Thus, as compared with the case where six or more load ports are linearly arranged on one side surface of the loader module 14, the size of the loader module (footprint) does not increase. This makes it possible to limit an increase in the footprint of the substrate processing system 10. It is therefore possible to easily arrange the substrate processing system 10 in a clean room.

(Transport Method)

When transporting the FOUP, the OHT port T1 on the upstream side of the transfer machine 19 receives the FOUP 18 storing unprocessed wafers from the suspended external transport device 50. Further, the OHT port T2 on the downstream side of the transfer machine 19 delivers the FOUP 18 storing processed wafers to the suspended external transport device 50. In this way, the OHT port, the FIMS port and the transfer machine 19 are arranged directly under the OHT trajectory. After the FOUP 18 for unprocessed wafers is received by the OHT port T1 on the upstream side of the OHT transport path, the transfer machine 19 immediately delivers the FOUP 18 for processed wafers mounted on the OHT port T2 on the downstream side of the OHT transport path to the suspended external transport device 50. Alternatively, the OHT port T2 may receive the FOUP 18 for unprocessed wafers and the OHT port T1 may deliver the FOUP 18 for processed wafers.

In the case where there is only one OHT port, it was necessary to load the FOUP mounted on the OHT port to the FIMS port or unload the FOUP to the suspended external transport device 50 and then to deliver the subsequent FOUP to the OHT port. However, in the carrier transport device 20 according to the present embodiment, the OHT ports T1 and T2 are provided on both sides of the transfer machine 19. Therefore, one OHT port is used as a loading port and the other OHT port is used as an unloading port. This makes it possible to shorten the transport time of the FOUP 18.

In the carrier transport device 20, an opening U is formed having a height of 500 mm or more and a width of 600 mm or more, which serves as a passage through which the transfer machine 19 is retracted to a retracted position of the ceiling surface of the frame body 22a shown in FIG. 2B and moves toward the loader module 14. This allows the transfer machine 19 to move to the side of the loader module 14 by utilizing a space in which the transfer machine 19 is raised and lowered. The opening U can be used as a passage for maintenance of the process modules PM1 to PM6 and the like. The opening U is an example of a raising/lowering area in which the FOUP 18 is raised and lowered.

[Lid Opening/Closing Mechanism]

Figure 3:
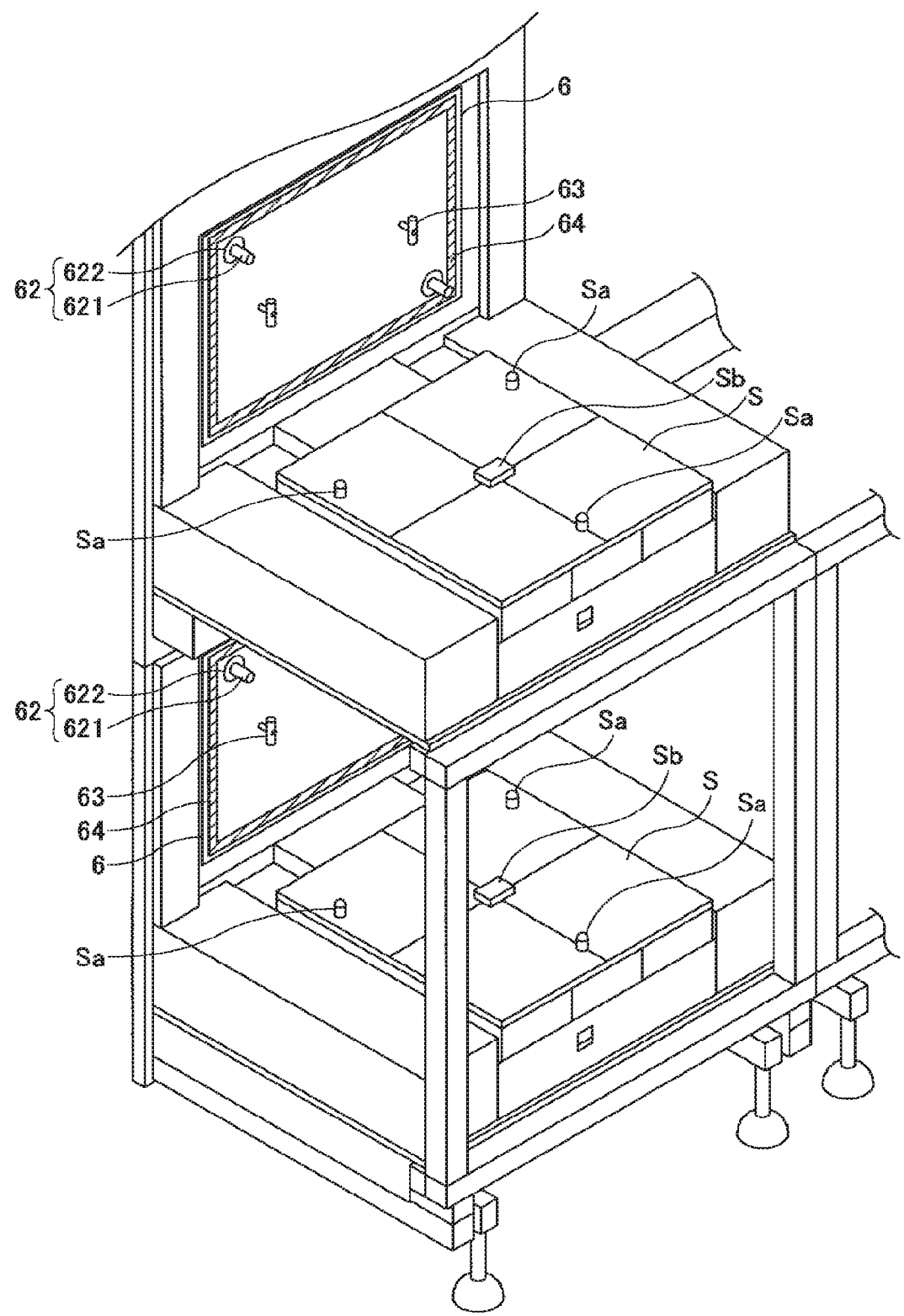
FIG. 3 is a view showing an example of an FIMS port according to one embodiment.

Next, the configuration of the lid opening/closing mechanism 6 provided in each of the FIMS ports P1 to P6 according to the present embodiment will be described with reference to FIGS. 3 and 4. The lid opening/closing mechanism 6 is provided on the side of the loader module 14 in each of the FIMS ports P1 to P6.

On the stage S, projections Sa for positioning the FOUP 18 are provided, for example, at three locations. Further, a hook Sb for fixing the FOUP 18 is provided on the mounting surface of the stage S.

The lid opening/closing mechanism 6 includes a lid holding portion 62, latch keys 63 and a packing 64, and has a function of detaching or attaching a lid of the FOUP 18. The lid holding portion 62 includes registration pins 621 and suction pad portions 622. The registration pins 621 are pins for positioning the FOUP by engaging with the recesses of the lid of the FOUP. The registration pins 621 are formed in a tubular shape and are connected to an exhaust system such as a vacuum pump or the like. The suction pad portions 622 are suction pads that suck and hold the lid of the FOUP.

In addition, the lid holding portion 62 vacuum-sucks and holds the lid of the FOUP by performing vacuum exhaust when the registration pins 621 engage with the recesses of the lid of the FOUP and by allowing the suction pad portions 622 to suck the lid of the FOUP.

The latch keys 63 are keys driven when attaching and detaching the lid of the FOUP. The latch keys 63 engage with insertion holes of the lid of the FOUP which will be described later. For example, the latch keys 63 are rotated 90 degrees from a vertical direction to a horizontal direction, thereby releasing the lock of the lid of the FOUP.

The packing 64 is arranged on the outer peripheral side of the latch keys 63. The packing 64 improves adhesion between the lid opening/closing mechanism 6 and the lid of the FOUP.

Figure 4:
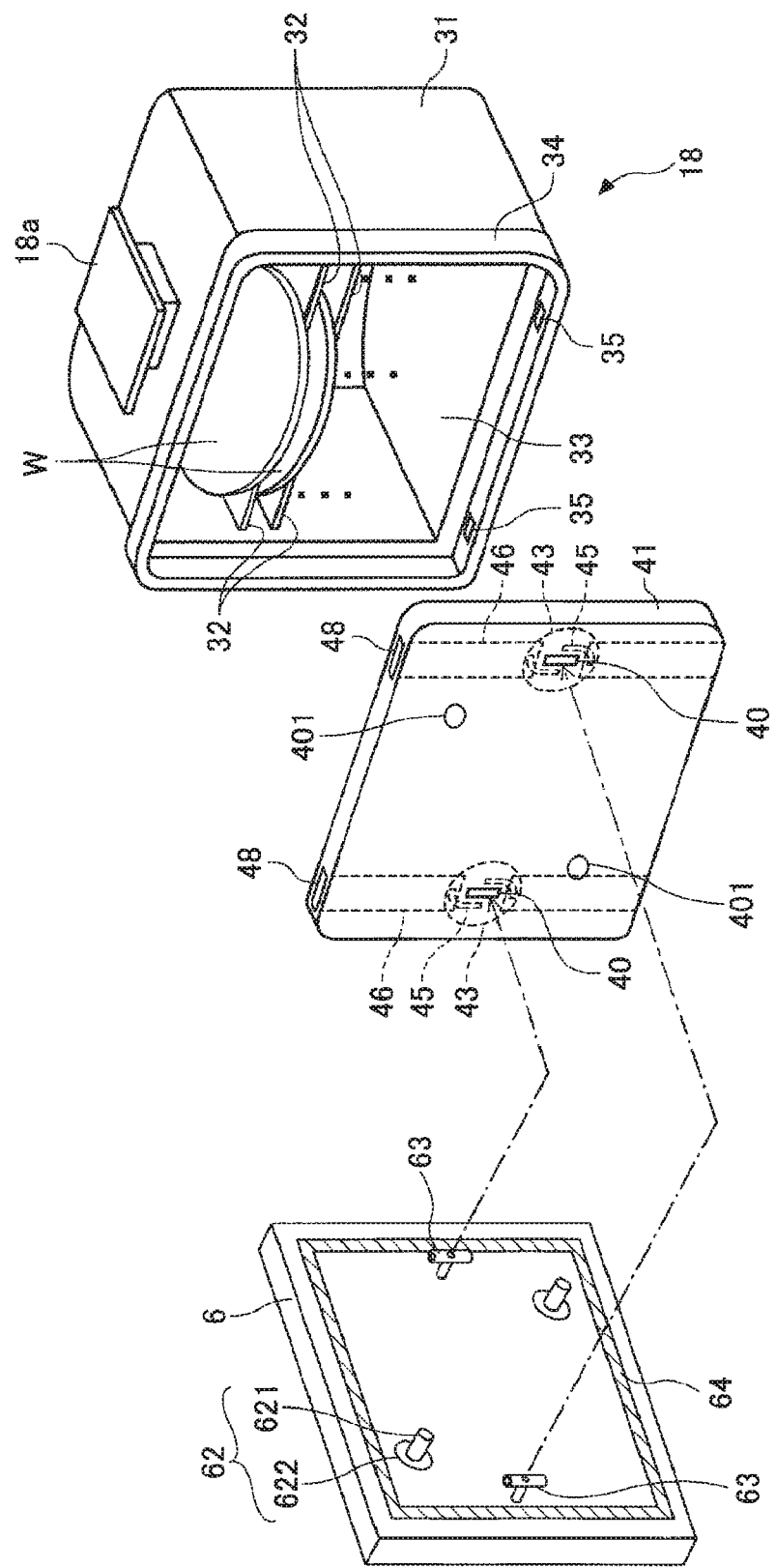
FIG. 4 is a view showing an example of a lid opening/closing mechanism of an FIMS port according to one embodiment.

As shown in FIG. 4, the FOUP 18 includes a main body 31 and a lid 41. The main body 31 is a container main body having a take-out opening 33 for a wafer W formed on a front surface which is one side surface. On the inner surface of the main body 31, support portions 32 for supporting the rear surface side peripheral portions of the wafers W are provided at multiple stages. Further, two engagement grooves 35 are formed on each of the upper and lower sides of the inner periphery of an opening edge portion 34 of the take-out opening 33.

On the upper portion of the main body 31, a handle portion 18a is provided to enable an arm 19a of the transfer machine 19 to grip the FOUP 18 when the transfer machine 19 transfers the FOUP 18. The lid 41 is a cover for covering the take-out opening 33 of the main body 31. On the back surface of the lid 41, rotatable disk-shaped rotation parts 43 are provided. As the rotation parts 43 are rotated by 90 degrees, pins are moved in slits 45 in response to the movement of the slits 45, whereby linear motion parts 46 are moved up and down. As a result, distal end portions of the linear motion parts 46 are moved into and out of the lid 41 via the opening portions 48 provided on the side surface side of the lid 41. The distal end portions of the linear motion parts 46 protruding outside of the lid 41 engage with engagement grooves 35 of the opening edge portion 34 of the main body 31, whereby the lid 41 is fixed to the main body 31. The FOUP 18 includes such a locking mechanism and can lock the lid 41 to the main body 31.

On the front surface of the lid 41, insertion holes 40 for the latch keys 63 are formed so as to overlap with the rotation parts 43. As the latch keys 63 are inserted into the insertion holes 40 and the rotation parts 43 are rotated by the latch keys 63, the locking of the lid 41 of the FOUP 18 can be released.

Further, on the front surface of the lid 41, positioning recesses 401 are formed. The registration pins 621 of the opposing lid holding portion 62 are inserted into the recesses 401 so that the lid opening/closing mechanism 6 and the FOUP 18 can be aligned with each other. When the registration pins 621 have engaged with the recesses 401, vacuum exhaust is performed and the lid 41 is sucked by the suction pad portions 622, whereby the lid 41 is held by vacuum suction.

[Modifications]

Figure 5A:
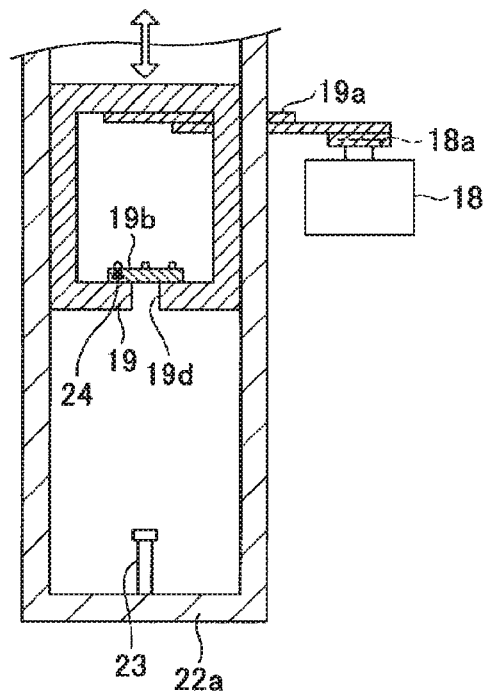
FIGS. 5A to 5C are views showing examples of a transfer machine of a carrier transport device according to modification 1 of one embodiment.

Next, modifications of the carrier transport device 20 according to the present embodiment will be described with reference to FIGS. 5A to 5C and 6. In the carrier transport device 20 according to a modification, as shown in FIG. 5A, the transfer machine 19 includes an opening 19*d* formed in the bottom portion thereof and a stage 19*b* arranged above the opening 19*d* inside the transfer machine 19 so as to be detachable (displaceable) from the transfer machine 19. Further, the housing 22 includes rod-shaped member 23 provided in the bottom portion of the frame body 22*a*.

Figure 5B:
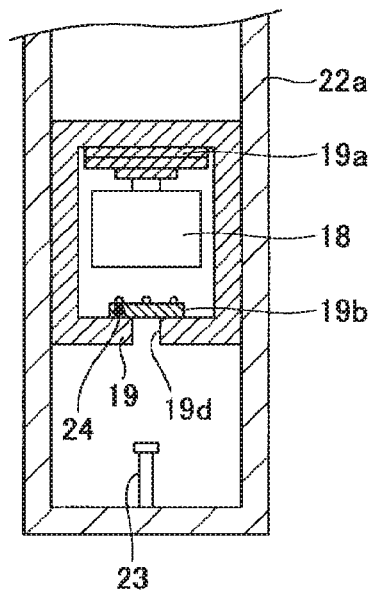
Figure 5C:
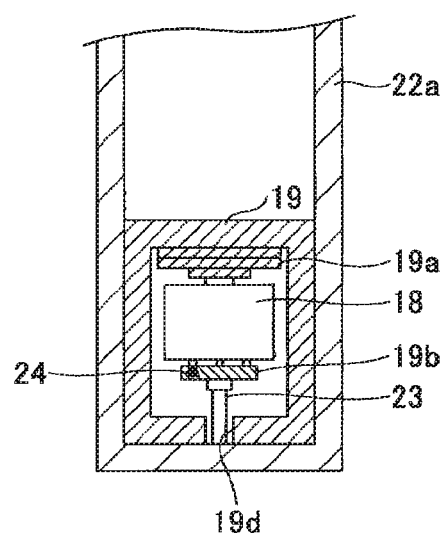

According to such a configuration, when receiving the processed FOUP 18, as shown in FIGS. 5A and 5B, the transfer machine 19 slidingly moves the arm 19*a* so as to grip the handle portion 18*a* of the FOUP 18 and moves the FOUP 18 into the transfer machine 19. Then, as shown in FIG. 5C, the opening 19*d* of the transfer machine 19 is moved down so as to be lower than the rod-shaped member 23, and the FOUP 18 is supported on the stage 19*b*. In this state, the arm 19*a* retracts and the FOUP 18 is mounted on the stage 19*b*. By lifting the transfer machine 19 together with the stage 19*b*, the FOUP 18 in the transfer machine 19 can be held at a predetermined height position. Further, by operating the transfer machine 19 in reverse, it is possible to transfer the unprocessed FOUP 18 to the FIMS ports P1 to P6.

As a method of transporting the FOUP 18 to the substrate processing system 10, there is a transport method using a PGV (Person Guided Vehicle) as well as the method of performing the OHT transport by having the FOUP 18 suspended from the ceiling using the suspended external transport device 50. The PGV is a floor-running vehicle. A factory employee steers a trackless rickshaw on which the FOUP 18 is placed, whereby the FOUP 18 is transported to the carrier transport device 20.

Therefore, in the carrier transport device 20 according to the present modification, the FOUP 18 can be held at an appropriate height when delivering the FOUP 18 to and from the trackless rickshaw in the PGV transport. As a result, the FOUP 18 can be easily loaded into and unloaded from the trackless rickshaw using the arm 19*a*.

Figure 6:
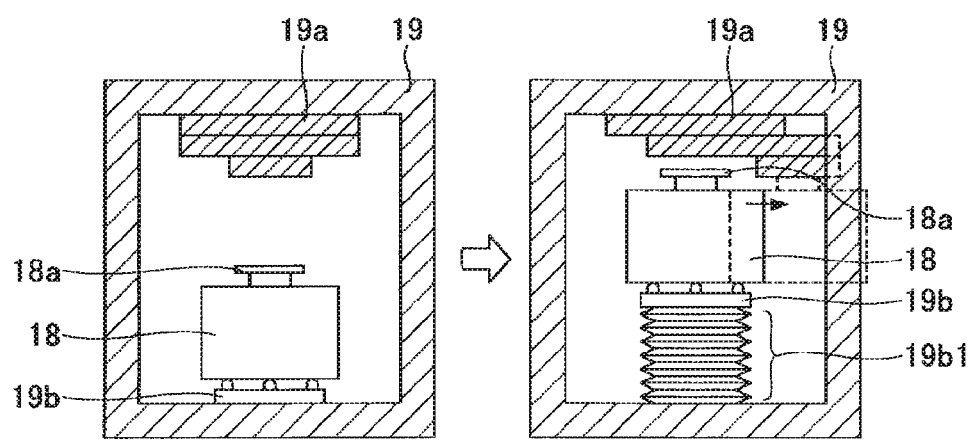
FIG. 6 is a view showing an example of a transfer machine of a carrier transport device according to modification 2 of one embodiment.

Further, as shown in FIG. 6, an extendable bellows 19*b*1 may be provided on the lower surface of the stage 19*b* in the transfer machine 19. This also makes it possible to hold the FOUP 18 at a predetermined height. Thus, the FOUP 18 may be easily loaded into and unloaded from the trackless rickshaw.

In this way, for example, the FIMS ports P2 and P6 of the second stage shown in FIGS. 2A and 2B may be used for the load ports for PGV transport. In this manner, it is possible to transport the FOUP using a specific FIMS port among a plurality of FIMS ports for transporting depending on the transport method of the FOUP 18.

As described above, according to the carrier transport device 20 of the present embodiment, the OHT ports T1 and T2, the transfer machine 19 and the FIMS ports P1 to P6 are arranged directly under the OHT transport trajectory. Further, the FIMS ports P1 to P6 are arranged to overlap with the OHT ports T1 and T2 in the height direction of the housing 22 in a plan view and are configured at multiple stages. This makes it possible to limit an increase in the size (footprint) of the substrate processing system 10.

Further, the OHT ports T1 and T2 are disposed on both sides of the transfer machine 19. As a result, after the transfer machine 19 mounts the FOUP 18 accommodating unprocessed wafers on the OHT port T1 on the upstream side of the OHT transport path, the transfer machine 19 can immediately deliver the FOUP 18 accommodating processed wafers, which is mounted on the OHT port T2 on the downstream side of the OHT transport path, to the suspended external transport device 50.

[Configuration of Carrier Transport Device and Transport Method]

Next, the configuration of the carrier transport device 20 according to a second embodiment of the present disclosure will be described with reference to FIGS. 7A to 7C. Even in the carrier transport device 20 according to the second embodiment, the FOUP 18 is delivered to and from the suspended external transport device 50.

Figure 7A:
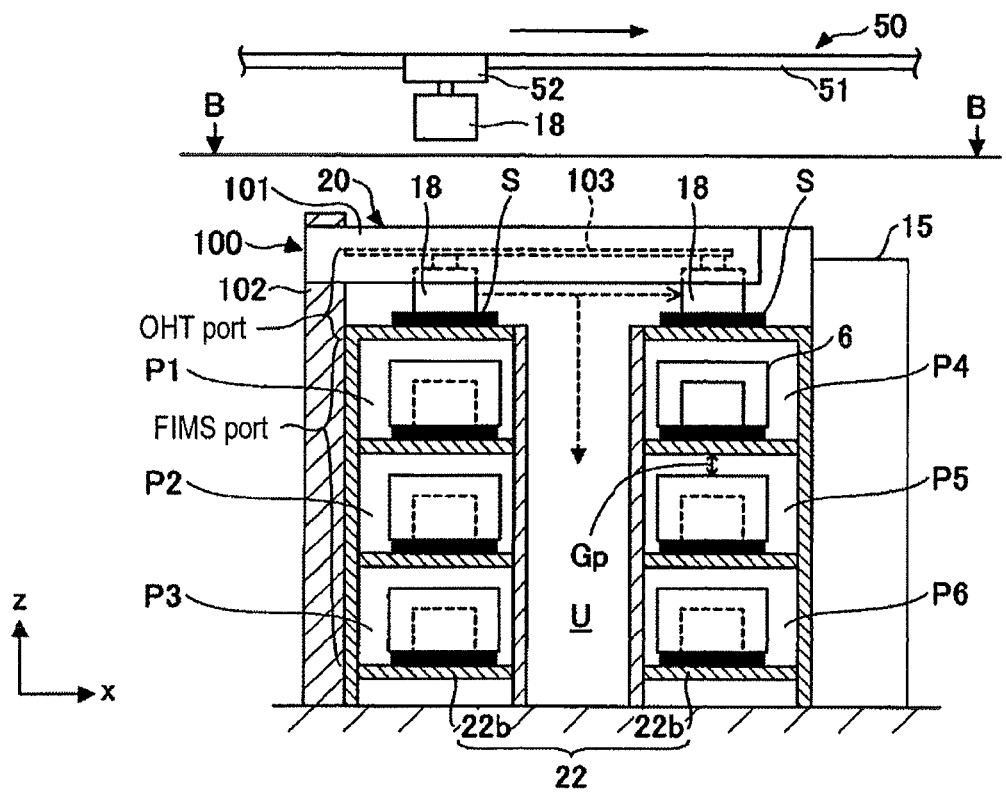
FIGS. 7A to 7C are views showing examples of a carrier transport device according to a second embodiment.
Figure 7B:
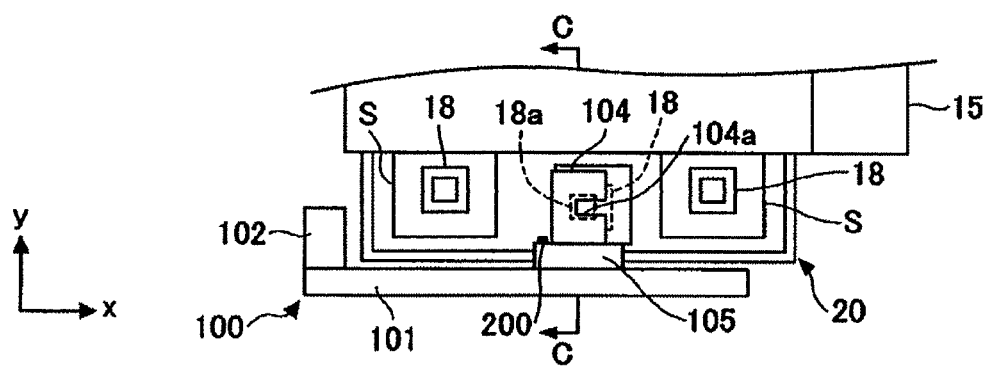
Figure 7C:
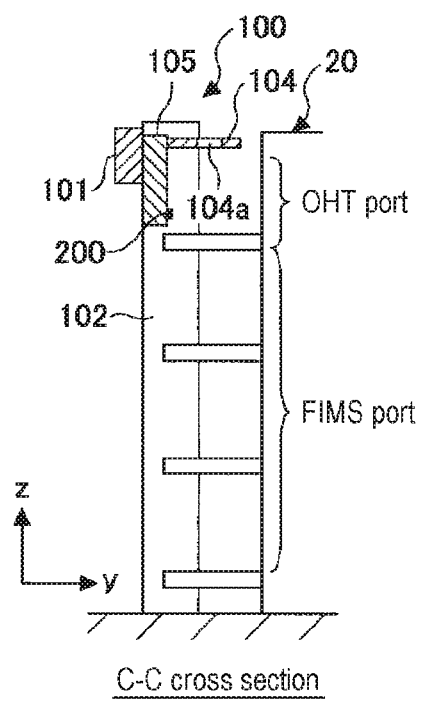

FIG. 7A shows an example of a vertical cross section of the carrier transport device 20 according to the second embodiment, FIG. 7B is a plan view showing an example of the carrier transport device 20 as viewed from line B-B in FIG. 7A, and FIG. 7C shows a cross section taken along the line C-C in FIG. 7B.

The carrier transport device 20 according to the second embodiment includes a housing 22 on which the FOUP 18 can be mounted. The housing 22 includes mounting tables 22*b* arranged on both sides of an opening U.

At the uppermost stage of the housing 22, an OHT port for delivering the FOUP 18 to and from the suspended external transport device 50 is provided. At the lower stage of the OHT port, FIMS ports P1 to P6 are arranged vertically at three stages on both sides of the opening U.

The difference from the carrier transport device 20 according to the first embodiment is that, in the present embodiment, an orthogonal robot 100 performs delivery of the FOUP 18 from the OHT port to the FIMS port. The orthogonal robot 100 includes an elevator shaft 102 positioned on one side of the housing 22 and provided along the side wall of the housing 22, and a slide shaft 101 extending in a direction orthogonal to the elevator shaft 102. The elevator shaft 102 supports the slide shaft 101 such that the slide shaft 101 may move up and down. The slide shaft 101 includes a rail 103 for causing the FOUP 18 placed on the stage S of the OHT port to slide along the longitudinal direction of the slide shaft 101. As shown in FIGS. 7B and 7C, in the slide shaft 101, a hand portion 104 for holding the FOUP 18 is fixed to a base portion 105. The base portion 105 is slidably provided on the rail 103. The hand portion 104 includes a recess portion 104a and grips the FOUP 18 by inserting the recess portion 104a into the narrowed portion of the handle portion 18a of the FOUP 18. The orthogonal robot 100 horizontally slides the FOUP 18 to the upper side of a passage formed by the opening U, in a state in which the FOUP 18 is gripped by the hand portion 104. The orthogonal robot 100 further transports the FOUP 18 in the vertical direction within the path formed by the opening U by raising and lowering the elevator shaft 102 in a state in which the FOUP 18 is gripped by the hand portion 104 and further slidingly moves the FOUP 18 to a desired FIMS port. The hand portion 104 and the base portion 105 are an example of a grip part. The grip part is not limited thereto and may be a gripper which has a grip function for holding the FOUP 18.

When transporting the FOUP 18 between the OHT ports, the orthogonal robot 100 transports the FOUP 18 in the horizontal direction by the slide shaft 101 while holding the FOUP 18 with the hand portion 104, and mounts the FOUP 18 on the stage S of the OHT port of transport destination.

According to the carrier transport device 20 of the present embodiment, the elevator shaft 102 is not provided inside the opening U but is provided outside the housing 22. Thus, it is not necessary to retract the transfer machine 19 as in the first embodiment. It is possible to widely secure the opening U as a maintenance path leading to the side of the loader module 14.

Further, according to the carrier transport device 20 of the present embodiment, it is unnecessary to insert the arm 19a of the transfer machine 19 into the vicinity of the ceiling portion of the FIMS port and to grip the FOUP 18 as in the first embodiment. That is, according to the carrier transport device 20 of the present embodiment, the hand portion 104 thinner than the arm 19a is inserted into the FIMS port to grip the FOUP 18. Therefore, in the present embodiment, the hand portion 104 having a simpler structure than the arm 19a of the transfer machine 19 according to the first embodiment is used as the mechanism for gripping the FOUP 18. This makes it possible to reduce a vertical dimension (Gp) between the FIMS ports. Therefore, it is possible to thicken the FOUP stage of the FIMS port in the height direction, thereby increasing the degree of freedom in designing the FIMS port.

As shown in FIGS. 7B and 7C, in the carrier transport device 20 according to the second embodiment, a reader 200 for reading a carrier ID is attached to a grip portion (here, the base portion 105). The reader 200 automatically transmits the read carrier ID to a computer of an operator managing the transport of the FOUP 18. Based on the transmitted carrier ID, the computer can centrally manage the transport status of the FOUP 18 in the substrate processing system 10.

Figure 8:
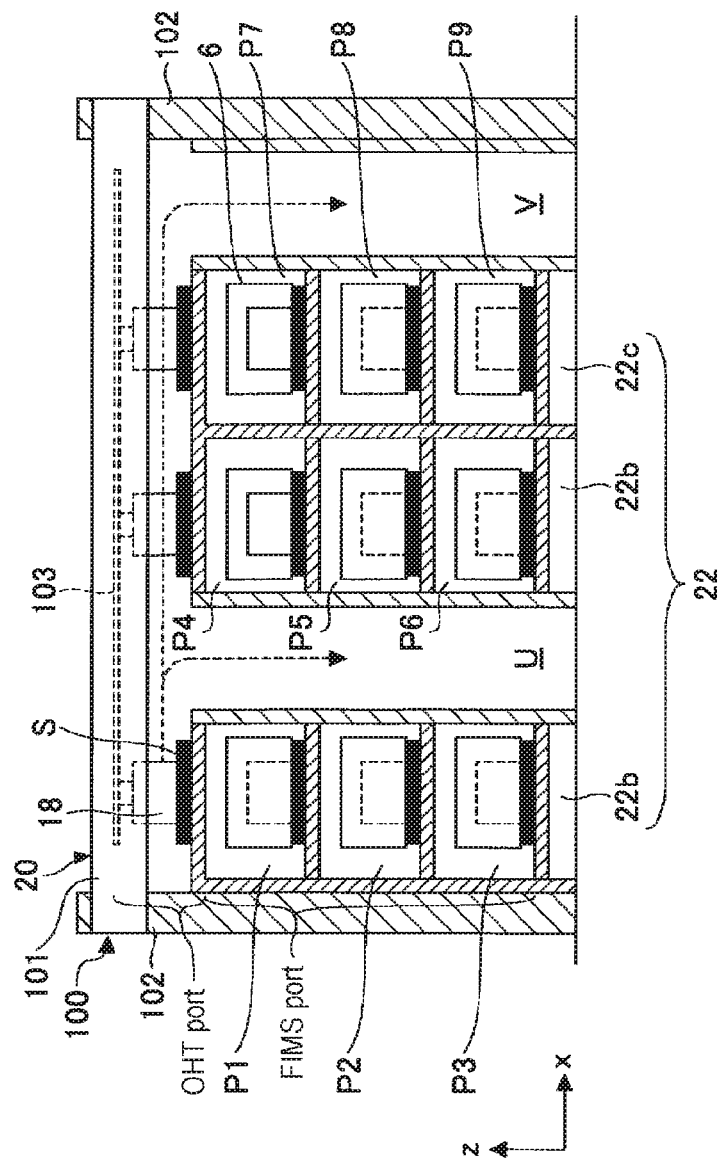
FIG. 8 is a view showing a modification of the carrier transport device according to the second embodiment.

The elevator shaft 102 may be provided on one side wall of the carrier transport device 20 as in the second embodiment. Alternatively, two elevator shafts 102 may be provided along both side walls of the carrier transport device 20 as in a modification of the carrier transport device 20 according to the second embodiment shown in of FIG. 8. In FIG. 8, the housing 22 includes a mounting table 22c disposed on one side of an opening V, in addition to the mounting tables 22b arranged on both sides of the opening U. Thus, in the modification shown in FIG. 8, FIMS ports P1 to P9 are arranged vertically at three stages and in three rows in the lower stage of the OHT port. The orthogonal robot 100 slidingly moves the FOUP 18 in the horizontal direction to a position above a passage formed by the opening U or the opening V, in a state in which the FOUP 18 is gripped by the hand portion 104. The orthogonal robot 100 further transports the FOUP 18 in the vertical direction within the path formed by the opening U or the opening V by raising and lowering the elevator shaft 102 in a state in which the FOUP 18 is gripped by the hand portion 104, and further slidingly moves the FOUP 18 to a desired FIMS port. The opening U and the opening V are an example of a raising/lowering area in which the FOUP 18 raised or lowered.

[SCARA Robot]

Figure 9A:
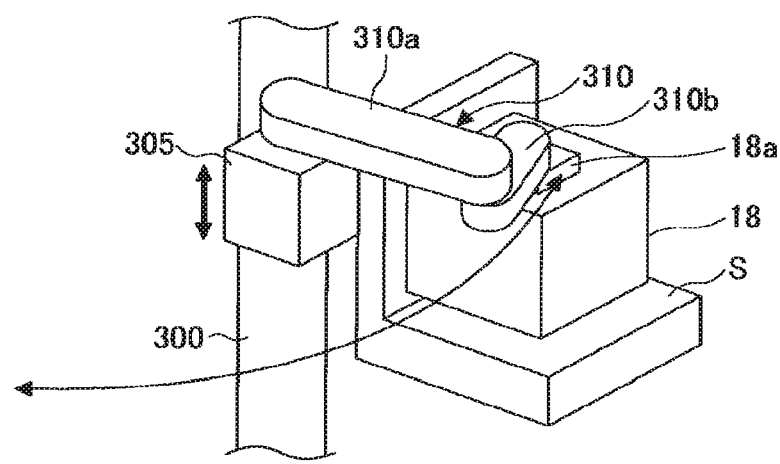
FIGS. 9A and 9B are diagrams showing examples of a SCARA robot according to one embodiment.
Figure 9B:
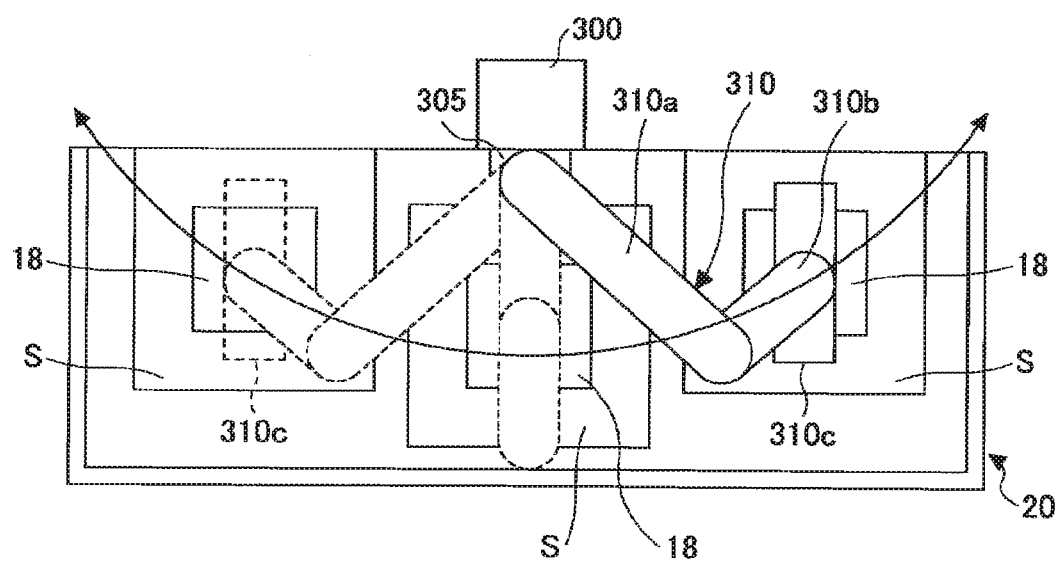

Finally, a modification of the transfer machine 19 shown in the first embodiment will be described with reference to FIGS. 9A and 9B. In this modification, a SCARA robot 310, in place of the arm 19a of the transfer machine 19, is disposed in the transfer machine 19. FIG. 9B shows an example of the SCARA robot 310 as seen in a plan view, and FIG. 9A is a perspective view of the SCARA robot 310.

The SCARA robot 310 is supported by an elevator shaft 300 provided in the opening U so as to be able to move up and down. Specifically, as shown in FIGS. 9A and 9B, one end portion of a first arm 310a of the SCARA robot 310 is rotatably installed in a rotation shaft 305 which is attached to an elevator shaft 300 so as to be able to move up and down. One end portion of a second arm 310b rotatably supported by the first arm 310a is connected to the other end portion of the first arm 310a. The first arm 310a and the second arm 310b are an example of an arm of the transfer machine.

The first arm 310a is formed to be longer than the second arm 310b. The first arm 310a and the second arm 310b are swung while drawing a curve in a desired direction by driving a belt attached to each arm with a motor. The gear ratio (pulley ratio) of the first arm 310a, the second arm 310b and the FOUP grip portion 310c is designed to be 2:1:2.

With such a configuration, the first arm 310a and the second arm 310b are swung horizontally around the rotation shaft 305 by one driving source while holding the FOUP 18 with the FOUP grip portion 310c. As a result, the FOUP 18 is transported along a trajectory which is a curve drawn by the distal end of the second arm 310b. In other words, in the transfer machine 19 according to the first embodiment, the FOUP 18 is transported along a straight trajectory in the OHT port. However, in the transport performed by the SCARA robot 310 of the transfer machine 19 according to the present modification, the FOUP 18 is transported while drawing a curved trajectory in the OHT port. In addition, the first arm 310a is longer than the second arm 310b, and the gear ratio among the first arm 310a, the second arm 310b and the FOUP grip portion 310c is designed to be 2:1:2. Therefore, the FOUP 18 can be transported without bringing the FOUP 18 into contact with the elevator shaft 300. Thus, it is possible to construct the SCARA robot 310 having a long reach in a space-saving manner.

In the orthogonal robot 100 of the carrier transport device 20 according to the second embodiment, the orthogonal robot 100 includes the slide shaft 101 and slidingly moves on the rail 103 while gripping the handle portion 18a of the FOUP 18 with the hand portion 104. In contrast, in the SCARA robot 310, the first arm 310a is rotated about the rotation shaft 305. Therefore, the SCARA robot 310 can reduce the generation of particles as compared with the orthogonal robot 100. In other words, in the SCARA robot 310, the rotation shaft 305 and the first arm 310a are connected by a rotary bearing, and the contact area between the first arm 310a and the rotation shaft 305 is smaller than the contact area between the hand portion 104 of the orthogonal robot 100 and the slide shaft 101 (the rail 103).

As a result, in the SCARA robot 310, it is possible to reduce the generation of particles. Moreover, by covering the rotation shaft 305 with a dedicated cover, it is also possible to eliminate the generation of particles.

While the carrier transport device and the carrier transport method have been described in the above embodiments, the carrier transport device and the carrier transport method according to the present disclosure are not limited to the above embodiments. Various modifications and improvements may be made within the scope of the present disclosure. The matters described in the above embodiments may be combined unless a conflict arises.

Further, the substrate to be processed by the substrate processing system according to the present disclosure is not limited to a wafer and may be, for example, a large substrate for a flat panel display, a substrate for an EL element or a solar cell.

This international application is based upon and claims the benefit of priority from Japanese Patent Application No. 2015-028153, filed on Feb. 17, 2015, the entire contents of which are incorporated herein by reference.

EXPLANATION OF REFERENCE NUMERALS

10: substrate processing system, 12: transfer mechanism, 14: loader module, 15: expansion module, 16: transfer robot, 18: FOUP, 19: transfer machine, 19a: arm, 20: carrier transport device, 22: housing, 22a: frame body, 22b: mounting table, TM: transfer module, PM1 to PM6: process modules, LLM: load lock module, T1 or T2: OHT port, P1 to P6: FIMS ports, S: stage, W: wafer, GV: gate valve

What is claimed is:

1. A carrier transport device capable of delivering a carrier to and from an external transport device which transports the carrier, comprising:
   a housing on which the carrier is mountable;
   first ports provided in the housing and configured to deliver the carrier to and from the external transport device;
   second ports provided in the housing and provided with a lid opener; and
   a transfer machine provided in the housing and configured to transfer the carrier,
   wherein the first ports, the transfer machine and the second ports are disposed directly under a transport path of the external transport device,
   wherein the first ports and the second ports are disposed on both sides of the transfer machine,
   wherein the second ports are configured at multiple stages,
   wherein the transfer machine includes:
      an opening formed in a bottom portion of the transfer machine; and
      a stage disposed above the opening inside the transfer machine and configured to be displaceable inside the transfer machine,
   wherein the housing includes a rod-shaped member provided at a bottom portion of the housing, and
   wherein the rod-shaped member is inserted into the opening to support the stage, when the opening of the transfer machine is moved down beyond the rod-shaped member to the bottom portion of the housing.

2. The device of claim 1, wherein the second ports are disposed to overlap with the first ports in a height direction of the housing in a plan view.

3. The device of claim 1, wherein one of the first ports receives the carrier from the external transport device and the other of the first ports transfers the carrier to the external transport device.

4. The device of claim 1, wherein an opening of the device, which serves as a passage for movement toward a loader module, is provided in a space in which the transfer machine retreats to a predetermined retreating position and moves up and down.

5. The device of claim 1, wherein the number of the second ports is equal to the number of process modules for processing unprocessed substrates accommodated in the carrier.

6. A carrier transport method using a carrier transport device, comprising delivering a carrier to and from an external transport device by using the carrier transport device,
   wherein the carrier transport device includes:
      a housing on which the carrier is mountable;
      first ports provided in the housing and configured to deliver the carrier to and from the external transport device;
      second ports provided in the housing and provided with a lid opener; and
      a transfer machine provided in the housing and configured to transfer the carrier,
   wherein the first ports, the transfer machine and the second ports are disposed directly under a transport path of the external transport device,
   wherein the first ports and the second ports are disposed on both sides of the transfer machine,
   wherein, immediately after the carrier accommodating unprocessed substrates is received by one of the first ports on an upstream side of the transport path of the transfer machine, the carrier mounted on another one of the first ports on a downstream side of the transport path and configured to accommodate processed substrates is transferred to the external transport device,
   wherein the transfer machine includes:
      an opening formed in a bottom portion of the transfer machine; and
      a stage disposed above the opening inside the transfer machine and configured to be displaceable inside the transfer machine,
   wherein the housing includes a rod-shaped member provided at a bottom portion of the housing, and
   wherein the rod-shaped member is inserted into the opening to support the stage, when the opening of the transfer machine is moved down beyond the rod-shaped member to the bottom portion of the housing.

* * * * *